US011706901B2

United States Patent
Wu et al.

(10) Patent No.: US 11,706,901 B2
(45) Date of Patent: Jul. 18, 2023

(54) IMMERSION COOLING SYSTEM

(71) Applicant: Shenzhen Fulian Fugui Precision Industry Co., Ltd., Shenzhen (CN)

(72) Inventors: Jia-Hong Wu, New Taipei (TW); Hsin-Ting Lin, New Taipei (TW); Li-Wen Guo, Shenzhen (CN)

(73) Assignee: Shenzhen Fulian Fugui Precision Industry Co., Ltd., Shenzhen (CN)

( * ) Notice: Subject to any disclaimer, the term of this patent is extended or adjusted under 35 U.S.C. 154(b) by 0 days.

(21) Appl. No.: 17/708,205

(22) Filed: Mar. 30, 2022

(65) Prior Publication Data
US 2023/0189476 A1 Jun. 15, 2023

(30) Foreign Application Priority Data
Dec. 14, 2021 (CN) .......................... 202111560859.4

(51) Int. Cl.
*H05K 7/20* (2006.01)
(52) U.S. Cl.
CPC ..... *H05K 7/20236* (2013.01); *H05K 7/20263* (2013.01); *H05K 7/20272* (2013.01)
(58) Field of Classification Search
CPC ........... H05K 7/20236; H05K 7/20263; H05K 7/20272
See application file for complete search history.

(56) References Cited

U.S. PATENT DOCUMENTS

| | | | | |
|---|---|---|---|---|
| 7,286,356 | B2* | 10/2007 | Keenan | H05K 7/20572 312/236 |
| 7,971,632 | B2* | 7/2011 | Eriksen | H05K 7/20272 165/104.31 |
| 8,305,759 | B2* | 11/2012 | Attlesey | H05K 7/20772 165/80.4 |
| 8,369,090 | B2* | 2/2013 | Chester | H05K 7/20763 165/80.4 |
| 10,271,456 | B2* | 4/2019 | Tufty | H05K 7/20236 |
| 10,791,647 | B1* | 9/2020 | Miyamura | H05K 7/20272 |
| 10,939,581 | B1* | 3/2021 | Chen | H05K 7/20781 |
| 11,032,939 | B2* | 6/2021 | Tufty | H05K 7/20772 |
| 11,122,704 | B2* | 9/2021 | Archer | H05K 7/20763 |
| 11,366,499 | B2* | 6/2022 | Hung | G06F 1/181 |
| 11,481,009 | B1* | 10/2022 | Scott | H01L 23/473 |

(Continued)

FOREIGN PATENT DOCUMENTS

| | | |
|---|---|---|
| CN | 206348737 U | 7/2017 |
| CN | 208336452 U | 1/2019 |
| CN | 111352489 B | 5/2021 |

*Primary Examiner* — Abhishek M Rathod
(74) *Attorney, Agent, or Firm* — ScienBiziP, P.C.

(57) ABSTRACT

An immersion cooling system includes a first casing, a plurality of fins, a liquid-cooled pipeline, and a liquid-cooled system. The first casing is used for containing a dielectric liquid in which a heat-generating component is immersed. The plurality of fins are disposed on and located outside the first casing. The liquid-cooled pipeline containing a coolant is attached to the first casing. The liquid-cooled system is disposed outside the first casing and connected with the liquid-cooled pipeline to remove heat from the coolant in the liquid-cooled pipeline. The immersion cooling system dissipates heat through two heat exchange mechanisms, that is, natural convection heat loss and heat absorption by liquid cooling.

10 Claims, 7 Drawing Sheets

(56) References Cited

U.S. PATENT DOCUMENTS

| | | | | |
|---|---|---|---|---|
| 2002/0117291 | A1* | 8/2002 | Cheon | G06F 1/20 |
| | | | | 165/80.4 |
| 2008/0017355 | A1* | 1/2008 | Attlesey | G06F 1/181 |
| | | | | 165/104.33 |
| 2010/0039771 | A1* | 2/2010 | Marchand | H05K 7/20909 |
| | | | | 361/694 |
| 2013/0299232 | A1* | 11/2013 | Fitz-Patrick | H05K 7/20636 |
| | | | | 174/547 |
| 2014/0124174 | A1* | 5/2014 | Campbell | H05K 7/20809 |
| | | | | 29/890.035 |
| 2014/0216686 | A1* | 8/2014 | Shelnutt | H05K 7/203 |
| | | | | 165/96 |
| 2014/0218861 | A1* | 8/2014 | Shelnutt | H05K 7/20818 |
| | | | | 361/679.53 |
| 2018/0235107 | A1 | 8/2018 | Wiley | |
| 2018/0343770 | A1* | 11/2018 | Brink | H01L 23/44 |
| 2019/0380228 | A1* | 12/2019 | Hirai | H05K 7/20772 |
| 2020/0029464 | A1* | 1/2020 | Inano | H05K 7/20272 |
| 2021/0271299 | A1* | 9/2021 | Gauthier | H05K 7/20272 |
| 2021/0378142 | A1* | 12/2021 | Zhang | G06F 1/20 |

* cited by examiner

IMMERSION COOLING SYSTEM

FIELD

The subject matter herein generally relates to immersion cooling systems, in particular to an immersion cooling system with many heat-dissipating mechanisms.

BACKGROUND

At present, the cooling of electronic equipment may be in two general categories. First, a fan is used to drive air to flow through electronic components to absorb and take away heat from the electronic components. Second, the electronic components are immersed in a dielectric liquid, the heated liquid in a tank is sucked into a heat exchanger through a pump to exchange the absorbed heat with the heat exchanger, and then the cooled liquid is discharged back to the tank to complete a cycle, so that the heat generated by the electronic components is continuously dissipated. With advancement of science and technology, the power consumptions and heat-generating values of electronic components are increasing, which can bring the noise of high energy consumption when the fan or other dissipating system, including the heat exchanger and the pump, is used to dissipate heat from the electronic components.

BRIEF DESCRIPTION OF THE DRAWINGS

Implementations of the present technology will now be described, by way of embodiment, with reference to the attached figures.

DETAILED DESCRIPTION

The technical solutions in the embodiments of the present disclosure are clearly and completely described in the following with reference to the accompanying drawings in the embodiments of the present disclosure. The described embodiments are only some of the embodiments of the present disclosure, and not all of the embodiments. All other embodiments obtained by those skilled in the art based on the embodiments of the present disclosure without creative efforts are within the scope of the present disclosure.

Unless otherwise defined, all technical and scientific terms used herein have the same meaning as those understood in the art. The terminology used in the description of the present disclosure is for the purpose of describing particular embodiments and is not intended to limit the disclosure.

Some embodiments of the present disclosure are described in detail below with reference to the accompanying drawings. The features of the embodiments and examples described below can be combined with each other without conflict.

Figure 1:
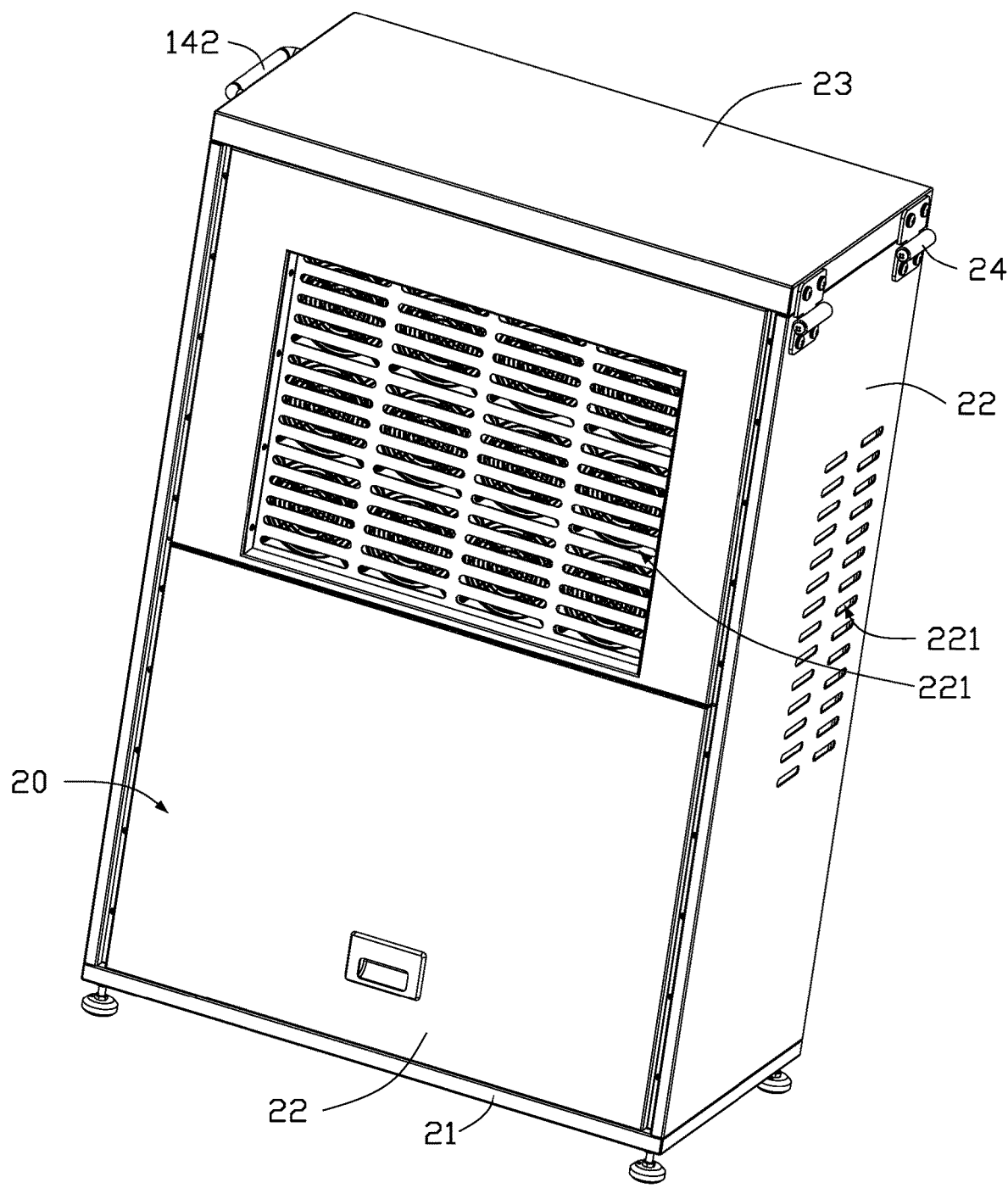
FIG. 1 is a perspective view of an immersion cooling system according to an embodiment of the present disclosure.
Figure 2:
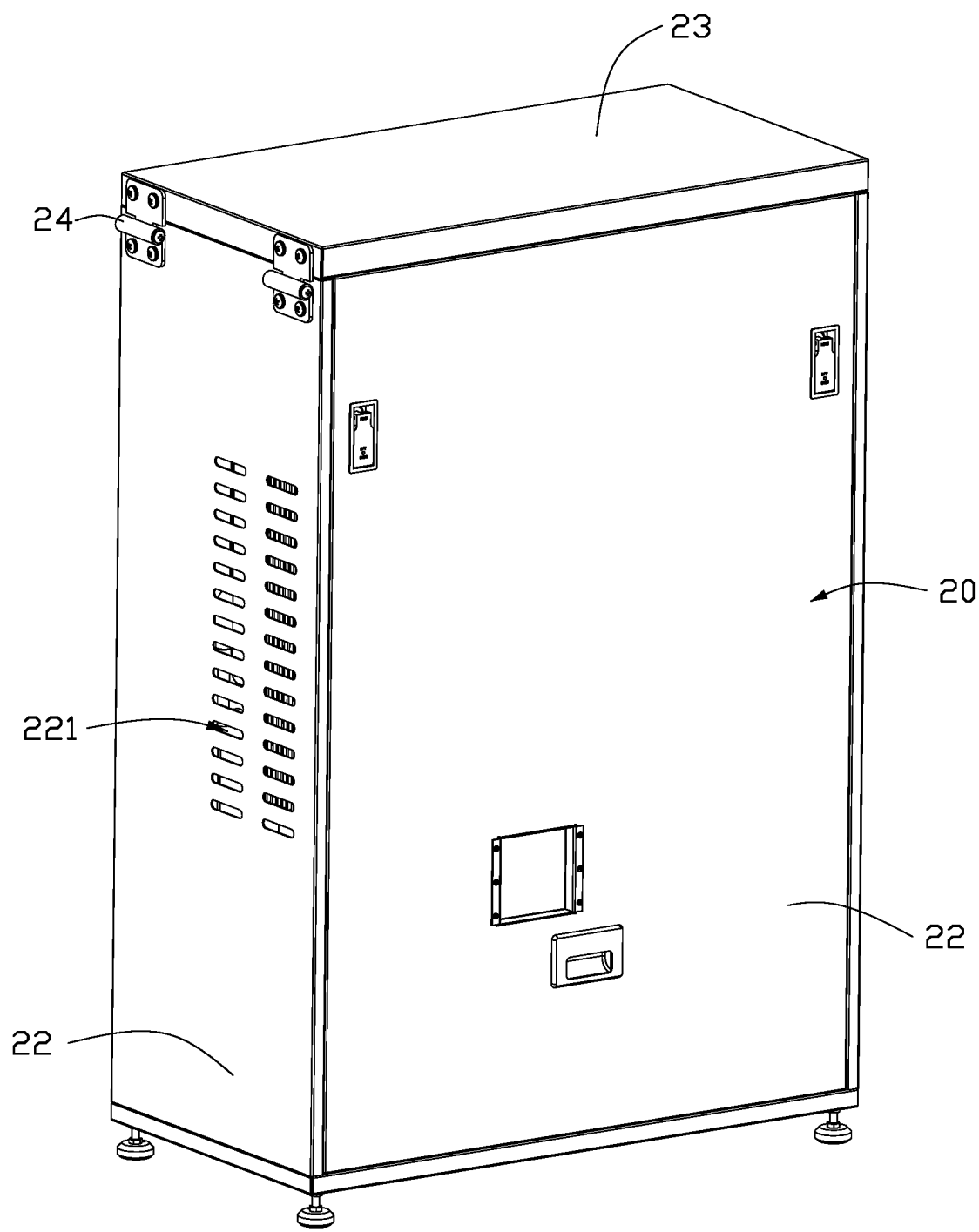
FIG. 2 is a perspective view of the immersion cooling system of FIG. 1 from another perspective.
Figure 3:
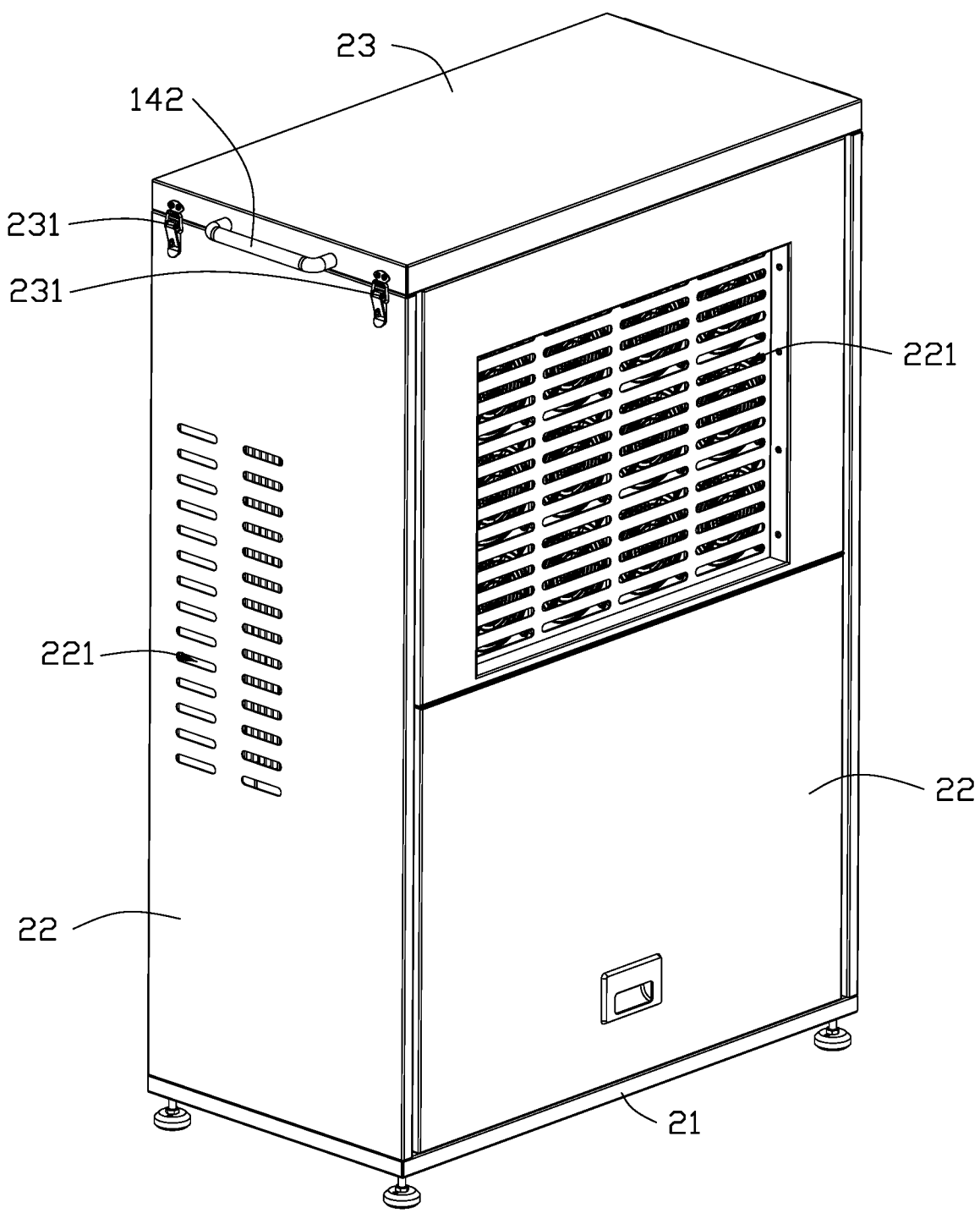
FIG. 3 is a perspective view of the immersion cooling system of FIG. 1 from another perspective.
Figure 4:
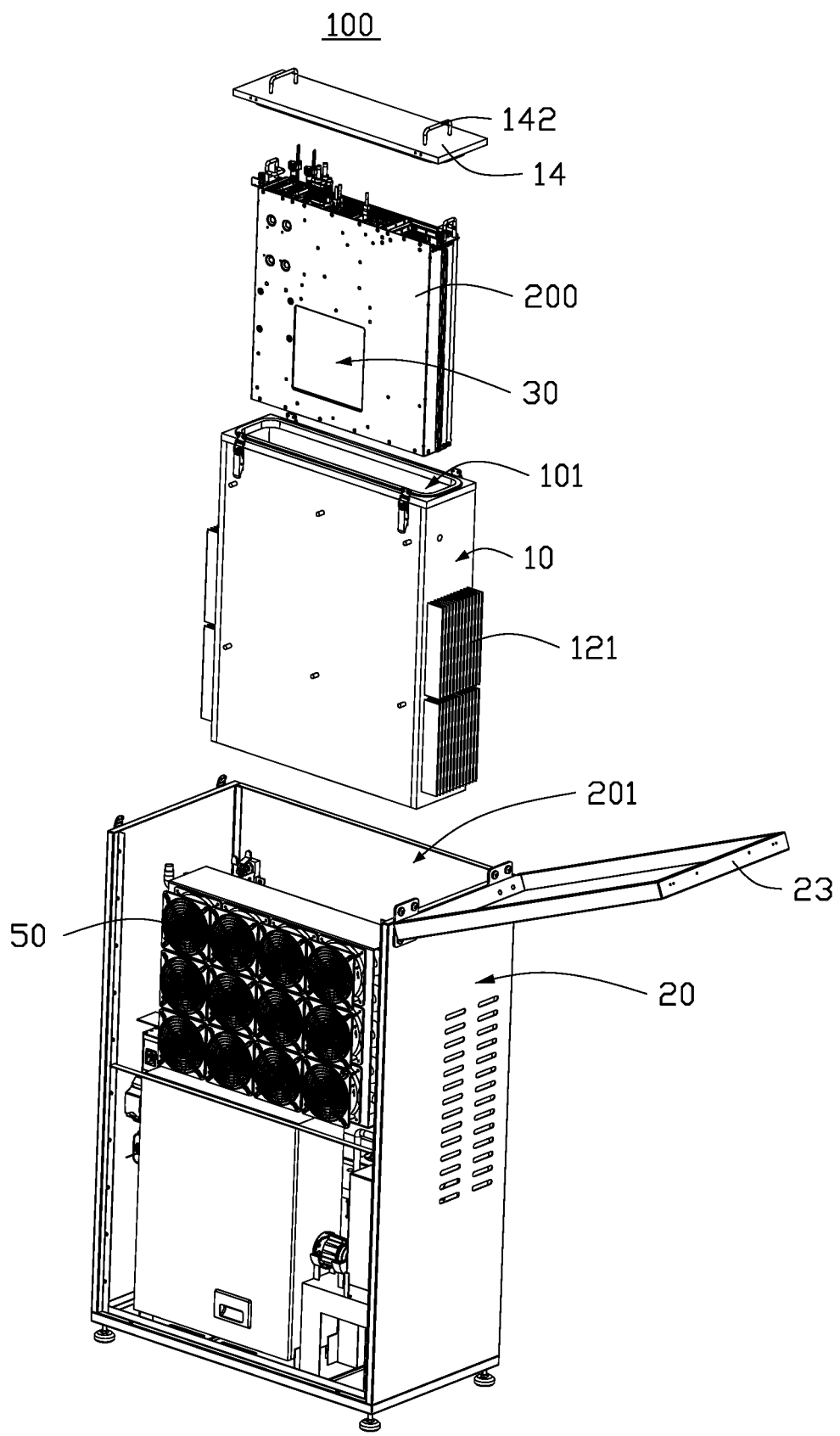
FIG. 4 is an exploded view of the immersion cooling system of FIG. 1.
Figure 5:
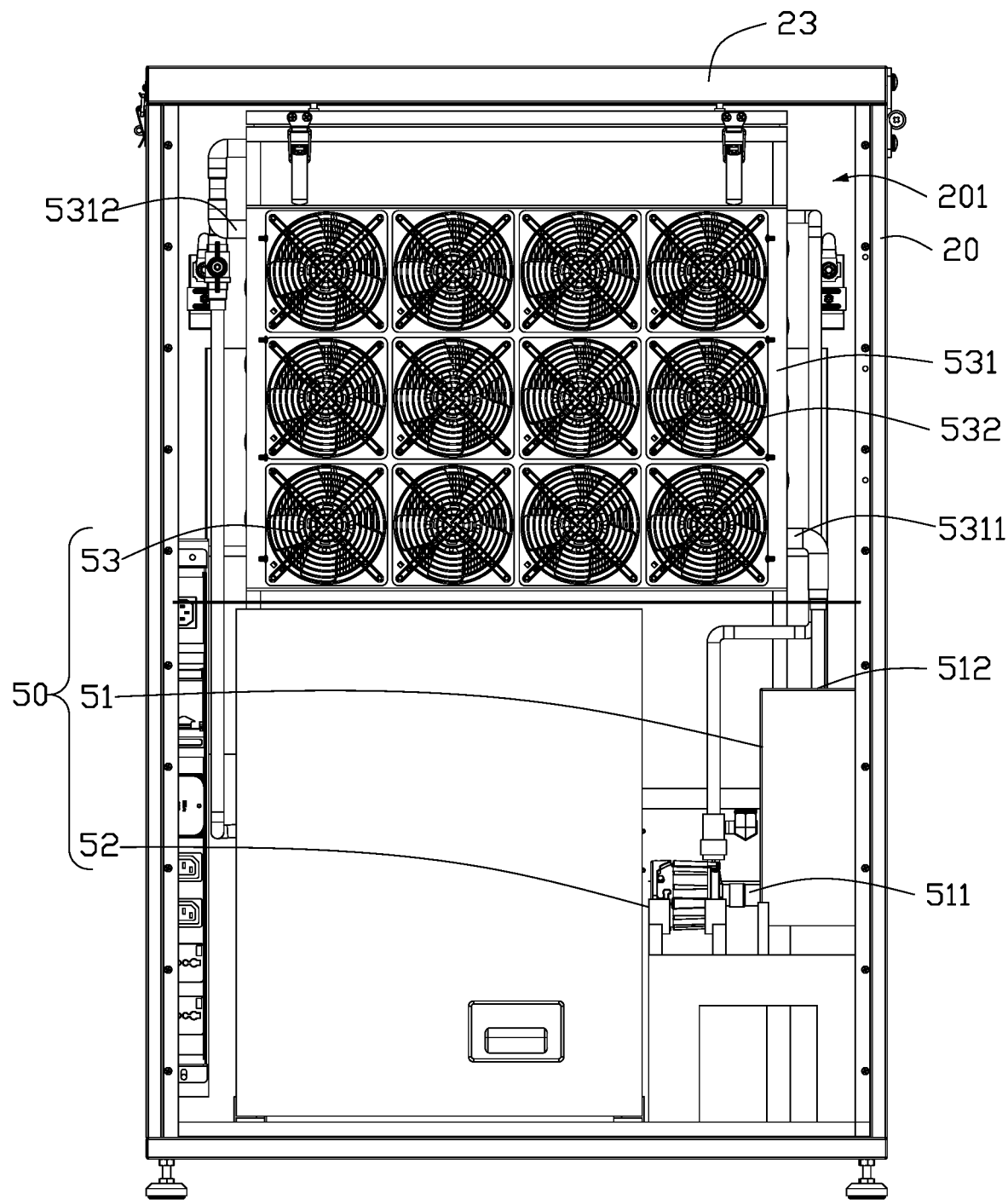
FIG. 5 is a schematic diagram of a local structure of the immersion cooling system of FIG. 1.
Figure 6:
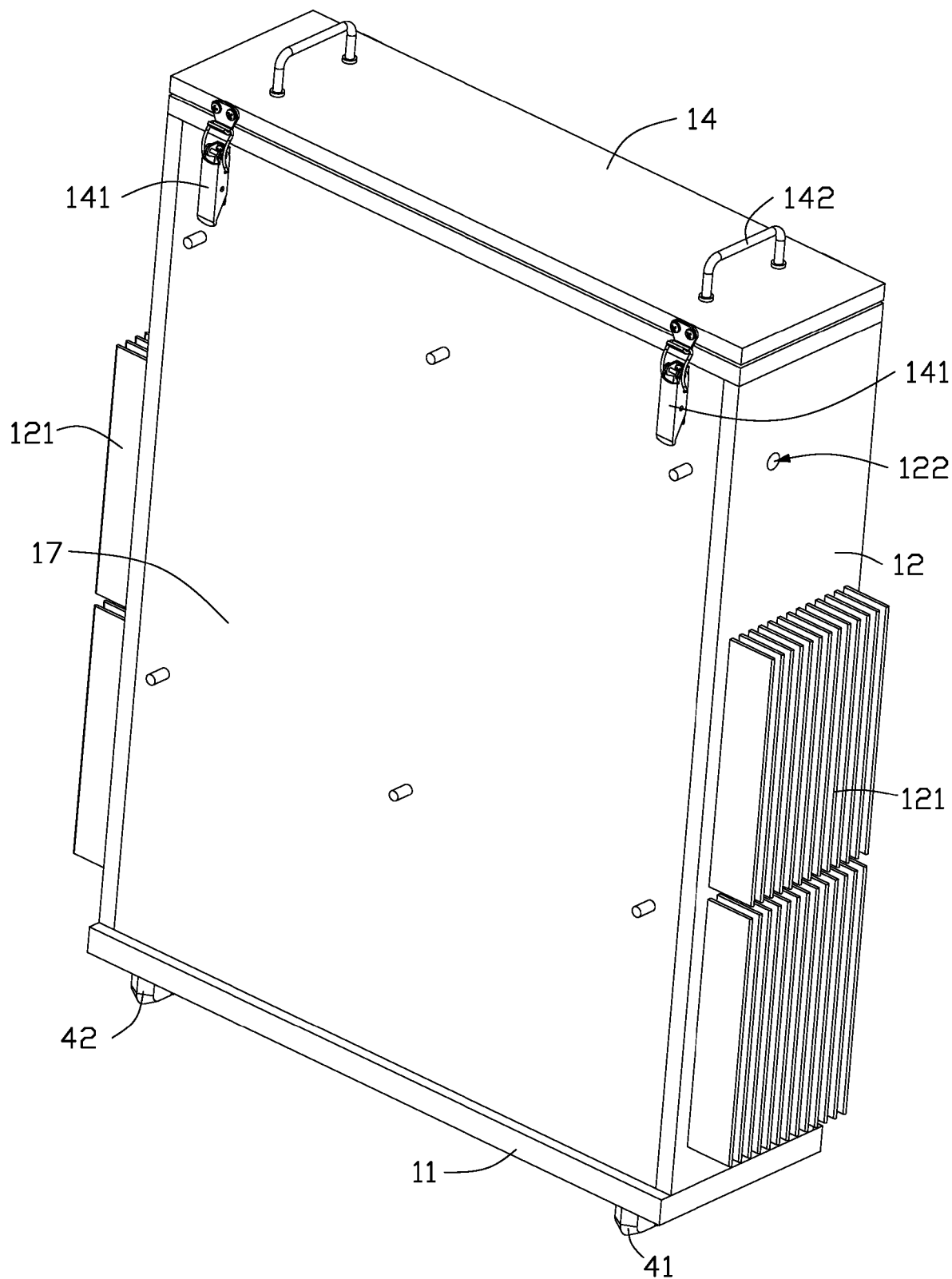
FIG. 6 is a perspective view of a first casing of the immersion cooling system of FIG. 1.
Figure 7:
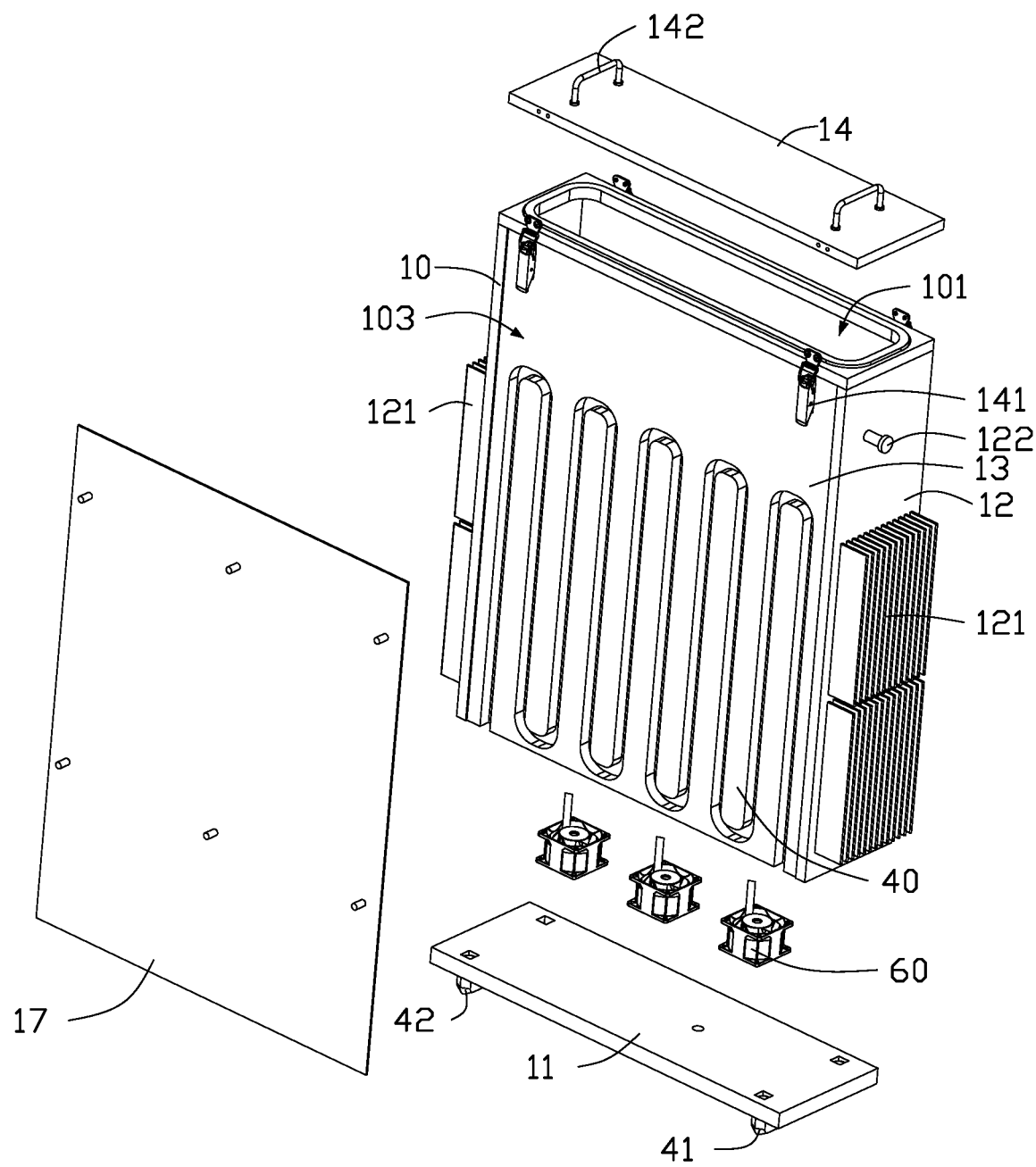
FIG. 7 is an exploded view of the first casing of FIG. 6.

Referring to FIGS. 1 to 7, an embodiment of an immersion cooling system 100 is shown. The immersion cooling system 100 is used to cool a heat-generating component 200. The heat-generating components 200 may be servers, electronic chips, batteries, etc. The immersion cooling system 100 includes a first casing 10, a second casing 20, a liquid-cooled plate 30, two liquid-cooled pipelines 40, and a liquid-cooled system 50. The first casing 10 is suitable for housing a dielectric liquid (not shown) in which the heat-generating component 200 is immersed. The dielectric liquid may be, but is not limited to, synthetic oil or fluorinated liquid. The first casing 10 and the liquid-cooled system 50 are fixed in the second casing 20. The liquid-cooled plate 30 is disposed on the heat-generating component 200 and is suitable for containing a coolant, such as water. The liquid-cooled pipelines 40 are disposed on the first casing 10 and are suitable for containing the coolant. The liquid-cooled system 50 is connected with the liquid-cooled plate 30 and the liquid-cooled pipelines 40 so that the liquid-cooled system 50 can take heat from the coolant contained in the liquid-cooled plate 30 and the liquid-cooled pipelines 40.

The first casing 10 includes a first bottom plate 11, a plurality of side plates, and a first top plate 14. The plurality of side plates protrude vertically from the first bottom plate 11 and are positioned around a periphery of the first bottom plate 11. The first bottom plate 11 and the plurality of side plates cooperatively form a first accommodation cavity 101. The first top plate 14 is disposed on sides of the plurality of side plates away from the first bottom plate 11 for enclosing the first accommodation cavity 101. The first top plate 14 can cover the plurality of side plates to enclose and seal the first accommodation cavity 101 and can be opened relative to the plurality of side plates to expose the first accommodation cavity 101. In one embodiment, the plurality of side plates include two opposite first side plates 12 and two opposite second side plates 13.

In some embodiments, two first latching structures 141 matched with each other are disposed on one of the side plates and the first top plate 14 and fixedly connect the first top plate 14 and the one of the side plates when the first top plate 14 covers the first accommodation cavity 101. The two first latching structures 141 may be, but are not limited to, two clamping hooks or one clamping hook and one matching hole.

Each of the two first side plates 12 is provided with a plurality of first fins 121 thereon. The first fins 121 are located outside the first casing 10. Each of the first fins 121 extends along a height direction of the first casing 10. The first fins 121 are made of a heat conducting material. A material of the first fins 121 can be, but is not limited to, aluminum. Heat generated by the heat-generating component 200 is transferred to the first casing 10 through the dielectric liquid, and then the first fins 121 dissipate the heat, using natural convection heat exchange. A first pipeline connection 122 and a second pipeline connection (not shown) are disposed on the two first side plates 12 and are configured to connect to a pipe.

The liquid-cooled plate 30 is attached to the heat-generating component 200. The liquid-cooled plate 30 may be, but is not limited to, fixed to the heat-generating component 200 by a heat-conducting adhesive (not shown).

The two liquid-cooled pipelines 40 are disposed on the two second side plates 13 and are located outside the first accommodation cavity 101. In some embodiments, opposite edges of each of the two first side plates 12 and opposite edges of the first bottom plate 11 protrude out of the two second side plates 13, so that each of the two second side plates 13, the two first side plates 12, and the first bottom plate 11 cooperatively form a third accommodation cavity 103. The two liquid-cooled pipelines 40 are accommodated in two third accommodation cavities 103. The immersion cooling system 100 also includes a liquid inlet part 41 and a liquid outlet part 42. The liquid inlet part 41 and the liquid outlet part 42 are disposed on the first bottom plate 11, and each of the two liquid-cooled pipelines 40 penetrates the first bottom plate 11 to communicate with the liquid inlet part 41 and the liquid outlet part 42.

In some embodiments, the first casing 10 also includes two cover plates 17. Each of the two cover plates 17 is disposed on edges of the two first side plates 12 and an edge of the first bottom plate 11 which are located on a same side of the first casing 10 for enclosing the third accommodation cavity 103, so as to protect the two liquid-cooled pipelines 40 in the third accommodation cavities 103. It is to be understood, the first top plate 14 also covers the two third accommodation cavities 103, and one of the two first latching structures 141 may be disposed on one of the two cover plates 17 instead of the one of the side plates.

The liquid-cooled system 50 is arranged outside the first casing 10 and includes a liquid storage tank 51, a pump 52, and a heat sink 53. The liquid storage tank 51 is used to store the coolant, and the heat sink 53 is used to cool the coolant passing through it. The liquid storage tank 51 includes a first liquid inlet 511 and a first liquid outlet 512.

In some embodiments, the heat sink 53 includes a housing 531, a plurality of fans 532, and a plurality of second fins (not shown). The housing 531 is used to contain the coolant. The housing 531 includes a second liquid inlet 5311 and a second liquid outlet 5312. In one embodiment, the second liquid inlet 5311 is disposed at the bottom of the housing 531, and the second liquid outlet 5312 is disposed at the top of the housing 531. The second fins are disposed on the housing 531 and discharge the heat of the coolant flowing through the housing 531 to an external environment. The fans 532 face the second fins and generate a forced airflow flowing through the heat sink 53, so that the heat dissipation efficiency of the heat sink 53 is increased.

One end of the pump 52 is connected with the liquid inlet part 41 to connect the two liquid-cooled pipelines 40, other end of the pump 52 is connected with the first liquid inlet 511 of the liquid storage tank 51. The first liquid outlet 512 is connected with the second liquid inlet 5311 of the heat sink 53, and the second liquid outlet 5312 of the heat sink 53 is connected with the liquid outlet part 42 to connect the two liquid-cooled pipelines 40. The liquid-cooled pipelines 40, the pump 52, the liquid storage tank 51, and the heat sink 53 thereby form a first communication circuit. The heat generated by the heat-generating component 200 is transferred to the first casing 10 through the dielectric liquid, and then transferred to the coolant contained in the liquid-cooled pipelines 40 through the liquid-cooled pipelines 40. In the first communication circuit, the pump 52 transports the heated coolant in the liquid-cooled pipelines 40 to the heat sink 53, the heat is discharged to the external environment through the heat sink 53, and then the cooled coolant is transported back to the liquid-cooled pipelines 40 to again cool the coolant contained in the liquid-cooled pipelines 40, so that the heat-generating component 200 is cooled.

The one end of the pump 52 is also connected with the first pipeline connection 122, and the first pipeline connection 122 is connected with the liquid-cooled plate 30. The other end of the pump 52 is connected with the first liquid inlet 511 of the liquid storage tank 51, and the first liquid outlet 512 is connected with the second liquid inlet 5311 of the heat sink 53, the second liquid outlet 5312 of the heat sink 53 is also connected with the second pipeline connection. The liquid-cooled plate 30, the pump 52, the liquid storage tank 51, and the heat sink 53 thus form a second communication circuit. The heat generated by the heat-generating component 200 is also transferred to the coolant contained in the liquid-cooled plate 30 through the liquid-cooled plate 30. In the second communication circuit, the pump 52 also transports the heated coolant in the liquid-cooled plate 30 to the heat sink 53, the heat is discharged to the external environment through the heat sink 53, and then the cooled coolant is transported back to the liquid-cooled plate 30 to again cool the coolant contained in the liquid-cooled plate 30, so that the heat-generating component 200 is cooled.

In some embodiments, the liquid-cooled system 50 includes a plurality of heat sinks 53. An end of the pump 52 communicates with the plurality of heat sinks 53 through a plurality of tee joints (not shown), each of the tee joints communicates with two heat sinks 53.

The second casing 20 includes a second bottom plate 21, a plurality of third side plates 22 protruding vertically from the second bottom plate 21, and a second top plate 23 disposed on sides of the plurality of third side plates 22 away from the second bottom plate 21. The second bottom plate 21 and the plurality of third side plates 22 cooperatively form a second accommodation cavity 201, and the second top plate 23 encloses the second accommodation cavity 201. The first casing 10 and the liquid-cooled system 50 are fixedly accommodated in the second accommodation cavity 201, and the first fins 121 and the fans 532 are exposed in the second accommodation cavity 201. The third side plates 22 define a plurality of vent holes 221, so that the heat from the first fins 121 and the liquid-cooled system 50 is dissipated outside the second casing 20 through the vent holes 221. In some embodiments, the first fins 121 and the fans 532 correspond in position to the vent holes 221, so that at least part of the first fins 121 and at least part of the fans 532 are exposed from the vent holes 221 to improve the heat dissipation efficiency.

In some embodiments, an edge of the second top plate 23 is rotatably connected with one of the third side plates 22 to facilitate the opening and closing of the second top plate 23. In one embodiment, the second top plate 23 and the one of the third side plates 22 are rotatably connected by a hinge 24.

In some embodiments, each of the first top plate 14 and the second top plate 23 is provided with a handle 142.

In some embodiments, two second latching structures 231 matched with each other are disposed on one of the third side plates 22 and the second top plate 23 and fixedly connect the second top plate 23 and the one of the third side plates 22 when the second top plate 23 encloses the second accommodation cavity 201. The two second latching structures 231 may be, but are not limited to, two clamping hooks or one clamping hook and one matching hole.

In some embodiments, the immersion cooling system 100 also includes an airflow generating device 60, the airflow generating device 60 is arranged at a bottom of the first accommodation cavity 101. The airflow generating device 60 may be, but is not limited to, a fan. The number of the airflow generating devices 60 may be set as needed. In one embodiment, the number of the airflow generating devices 60 is three.

In the immersion cooling system 100, the natural convection heat dissipation is carried out through the first fins 121 arranged on the first casing 10, and the liquid-cooling heat dissipation is carried out through the liquid-cooled pipelines 40 and the liquid-cooled system 50 arranged on the first casing 10, thereby the heat dissipation capacity is improved. In addition, the liquid-cooled system 50 only cools the coolant in the liquid-cooled pipelines 40 and the liquid-cooled plate 30 without directly cooling the dielectric liquid in the first accommodation cavity 101, energy consumption is thus decreased.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. An immersion cooling system comprising:
a first casing for containing a dielectric liquid in which a heat-generating component is immersed;
a plurality of fins disposed on and located outside the first casing;
a liquid-cooled pipeline attached to the first casing for containing a coolant; and
a liquid-cooled system disposed outside the first casing and connected with the liquid-cooled pipeline to take heat from the coolant in the liquid-cooled pipeline;
wherein the first casing comprises a first bottom plate, a first top plate, two first side plates opposite to each other, and two second side plates opposite to each other, the two first side plates and the two second side plates protrude from the first bottom plate and surround the first bottom plate to form a first accommodation cavity, the first top plate is disposed on sides of the two first side plates and the two second side plates away from the first bottom plate to enclose the first accommodation cavity, the plurality of fins are disposed on the two first side plates and located outside the first accommodation cavity, the liquid-cooled pipeline is disposed on one of the two second side plates and located outside the first accommodation cavity;
wherein two edges of the two first side plates and an edge of the first bottom plate protrude out of one of the two second side plates, the two first side plates, the first bottom plate, and the one of the two second side plates cooperatively form a third accommodation cavity, the liquid-cooled pipeline is accommodated in the third accommodation cavity, the first casing further includes a cover plate disposed on sides of the two first side plates and the first bottom plate to enclose the third accommodation cavity.

2. The immersion cooling system of claim 1, further comprising a liquid-cooled plate, wherein the liquid-cooled plate is attached to the heat-generating component and is accommodated in the first casing, the liquid-cooled plate is used for containing the coolant, the liquid-cooled system is further connected with the liquid-cooled plate to exchange heat with the coolant in the liquid-cooled plate.

3. The immersion cooling system of claim 2, wherein the liquid-cooled system comprises a liquid storage tank, a pump, and a heat sink, a first communication circuit is formed by the liquid-cooled pipeline, the liquid storage tank, the pump, and the heat sink, and a second communication circuit is formed by the liquid-cooled plate, the liquid storage tank, the pump, and the heat sink.

4. The immersion cooling system of claim 3, wherein the heat sink comprises a housing and a plurality of fans, the housing is used to contain the coolant, and the plurality of fans faces the housing to generate a forced airflow.

5. The immersion cooling system of claim 4, further comprising a second casing, wherein the second casing has a second accommodation cavity, the first casing and the liquid-cooled system are fixedly accommodated in the second accommodation cavity.

6. The immersion cooling system of claim 5, wherein the second casing comprises a second bottom plate, a plurality of third side plates protruding vertically from the second bottom plate, and a second top plate, the second bottom plate and the plurality of third side plates cooperatively form the second accommodation cavity, the second top plate is rotatably connected with one of the plurality of third side plates to enclose the second accommodation cavity.

7. The immersion cooling system of claim 6, wherein the second top plate and the one of the plurality of third side plates are rotatably connected by a hinge.

8. The immersion cooling system of claim 6, wherein two latching structures matched with each other are disposed on the second top plate and the one of the plurality of third side plates respectively.

9. The immersion cooling system of claim 5, wherein the second casing defines a plurality of vent holes communicating with the second accommodation cavity.

10. The immersion cooling system of claim 9, wherein at least part of the plurality of fins and at least part of the plurality of fans are exposed from the plurality of vent holes.

* * * * *